(12) United States Patent
Li et al.

(10) Patent No.: US 9,318,627 B2
(45) Date of Patent: Apr. 19, 2016

(54) SEMICONDUCTOR RADIATION DETECTOR

(71) Applicant: eV Products, Inc., Saxonburg, PA (US)

(72) Inventors: Handong Li, Pittsburgh, PA (US);
Michael Prokesch, Gibsonia, PA (US);
John F. Eger, Bentleyville, PA (US)

(73) Assignee: eV Products, Inc., Saxonberg, PA (US)

( * ) Notice: Subject to any disclaimer, the term of this patent is extended or adjusted under 35 U.S.C. 154(b) by 0 days.

(21) Appl. No.: 14/223,114

(22) Filed: Mar. 24, 2014

(65) Prior Publication Data
US 2014/0203392 A1      Jul. 24, 2014

Related U.S. Application Data

(62) Division of application No. 13/442,957, filed on Apr. 10, 2012, now Pat. No. 8,742,522.

(51) Int. Cl.
| | |
|---|---|
| *H01L 31/0224* | (2006.01) |
| *H01L 27/146* | (2006.01) |
| *H01L 31/08* | (2006.01) |
| *H01L 31/18* | (2006.01) |

(52) U.S. Cl.
CPC .. *H01L 31/022408* (2013.01); *H01L 27/14696* (2013.01); *H01L 31/085* (2013.01); *H01L 31/1828* (2013.01); *H01L 27/14676* (2013.01); *Y02E 10/543* (2013.01)

(58) Field of Classification Search
CPC .................... H01L 31/022408; H01L 31/085; H01L 31/1828
See application file for complete search history.

(56) References Cited

U.S. PATENT DOCUMENTS

| | | | |
|---|---|---|---|
| 4,879,466 A | 11/1989 | Kitaguchi et al. | |
| 4,896,200 A | 1/1990 | Seki et al. | |
| 5,677,539 A | 10/1997 | Apotovsky et al. | |
| 5,880,490 A | 3/1999 | Antich et al. | |
| 6,333,504 B1 | 12/2001 | Lingren et al. | |
| 7,157,716 B2 | 1/2007 | Kitaguchi et al. | |
| 7,297,955 B2 | 11/2007 | Amemiya et al. | |
| 7,355,185 B2 * | 4/2008 | Yasuda et al. ............ | 250/370.13 |
| 7,391,845 B2 | 6/2008 | Konno | |
| 7,528,378 B2 | 5/2009 | Yokoi et al. | |
| 7,728,304 B2 | 6/2010 | Chen et al. | |
| 7,741,610 B2 | 6/2010 | Spartiotis et al. | |
| 7,816,653 B2 | 10/2010 | Aurola | |
| 7,955,992 B2 | 6/2011 | Chen et al. | |
| 2006/0045511 A1 | 3/2006 | Genda | |

OTHER PUBLICATIONS

T. Shoji, et al., Evaluation of CdTe(Cl) crystal growth with THM, Nov. 15, 1992, pp. 324-330, vol. 322, Issue 3, Elsevier B.V., Holland.

* cited by examiner

*Primary Examiner* — Long Pham
(74) *Attorney, Agent, or Firm* — Clark Hill PLC

(57) ABSTRACT

A semiconductor radiation detector having a semiconductor substrate and first and second metal layers. The semiconductor substrate has substantially planar upper and lower opposing surfaces which have respective first and second surface areas. The first and second surface areas are defined by prospective dice lines. The first metal layer is on the substantially planar upper surface such that the first metal layer will have a surface area less than the first surface area of the substantially planar upper surface as defined by spaces on the substantially planar upper surface between the first metal layer and the prospective dice lines which define the first surface area. The second metal layer is on the substantially planar lower opposing surface.

32 Claims, 5 Drawing Sheets

SEMICONDUCTOR RADIATION DETECTOR

CROSS-REFERENCE AND INCORPORATION BY REFERENCE

This patent application is a Divisional of U.S. patent application Ser. No. 13/442,957, filed Apr. 10, 2012, and entitled "Method of Making a Semiconductor Radiation Detector". U.S. patent application Ser. No. 13/442,957 is hereby incorporated by reference in its entirety.

FIELD OF THE INVENTION

The invention relates to semiconductor radiation detectors and, more particularly, to a new and improved semiconductor radiation detector having enhanced radiation detection capabilities. The invention even more particularly relates to the method of making such an enhanced detector.

BACKGROUND OF THE INVENTION

Presently known semiconductor radiation detectors, particularly those designed for the detection of gamma and x-ray photons and charged particles and typically utilized in instruments for radiation spectroscopy, medical imaging, etc., are usually of a configuration in which the bulk-detecting crystals (e.g., cadmium telluride (CdTe) and cadmium zinc telluride (CdZnTe) crystals) which form the semiconductor plate or substrate are sandwiched between spaced-apart cathode and anode electrodes. Very often, the detector is of planar configuration with opposing planar surfaces and adjacent planar side walls perpendicular to the metalized surfaces. The cathode electrode (that normally positioned towards the radiation source) of such structures may comprise a metal layer, e.g., of gold, platinum, indium, etc., formed across one of these opposing surfaces. This cathode electrode may extend to the physical edges of the detector or, in certain configurations, may extend over the planar surface onto the detector's side walls. The anode electrode (that normally positioned away from the radiation source) is also typically planar and located on the opposing surface from the cathode. This anode electrode, like the cathode, may be in the form of a single metal layer, e.g., also gold, platinum, indium, etc. and also extend across the entire surface.

For more advanced high-resolution spectroscopy or imaging applications, the anode may comprise a plurality of pixel, strip and/or grid electrodes usually arranged in patterns with open regions or spaces separating the individual elements. Additional electrodes such as guard rings or bands may form part of this construction. Either or both of the electrodes may have the faces thereof subjected to further surface treatment and processing steps, e.g., to form interfaces of desired electrical properties. Multiple metal layers, diffusion barriers or other coatings may also be applied atop the primary contact surfaces to assure enhanced properties such as better mechanical robustness, solderability and/or long-term stability, it is further known to house such detectors within suitable housings.

Depending on the detector's application (e.g., the necessary stopping power, efficiency, pixel geometry, resolution, etc.), device thicknesses typically vary from a few microns to several centimeters with total detector areas ranging from less than square millimeter to tens of square centimeters. For larger fields of view, individual detectors may be oriented in arrays. Depending on the required device geometry and the grain sizes of the raw slices, several fabrication techniques may be considered when producing detectors of this type. Basically, a larger detector of sufficient thickness may be fabricated from an individual blank of somewhat larger size than that of the final detector. This blank may be further subjected to subsequent process steps such as etching or polishing. The fabrication of detectors with side wall extended electrodes (e.g., semi-hemispherical detectors) is typically limited to this individual blank approach. Alternatively, a multitude of detectors may be fabricated by dicing out the final devices from the wafer only at some point after electrode deposition. This approach, known in the semiconductor industry, is also referred to as "post-dicing." Dicing, also known as wafer dicing, is the process by which the individual semiconductor substrates are separated from a larger wafer of semiconductor material and may be accomplished by scribing and breaking, by mechanical sawing (normally with a machine called a dicing saw) or by laser cutting.

One technical limitation associated with the manufacture of high-resistivity semiconductor bulk detectors, including those having CdTe and CdZnTe crystals, is the difficulty of properly controlling side wall properties, especially attempting to prevent structural damage and to achieve sufficient electrical passivation. Such damage, contamination, etc. often results in excessive side surface leakage currents and/or noise generation when the final detector is exposed to high electric fields in which many such detectors are utilized. This may be a major problem with respect to detectors having a single anode electrode and/or cathode electrode deposited across the entire wafer surface. At high bulk resistivity and required high side surface resistance, certain processing issues such as the afore-described partial smearing of metal particles from the electrodes over the side walls during dicing can adversely affect sensitive device parameters. This problem cannot be readily addressed by surface passivation and can, particularly in the case of relatively very thin detectors, lead to total detector failure. Other effects from damage and contamination may of course contribute as well. One approach to hopefully prevent this is to fabricate some kind of guard electrode, so that the adverse effect on the actual readout electrode is limited. Doing so, of course, adds to the cost and complexity of the final product.

Examples of semiconductor radiation detectors are described in the following U.S. Pat. Nos. 7,955,992; 7,816,653; 7,741,610; 7,728,304; 7,528,378; 7,391,845; 7,355,185; 7,297,955; 7,157,716; 6,333,504; 5,880,490; 5,677,539; 4,896,200; and 4,879,466. In the most recent of these, U.S. Pat. No. 7,955,992, for example, there is described a method of making a semiconductor radiation detector where the CdZnTe semiconductor substrate has opposing planar surfaces and perpendicular side walls with one planar surface having a single layer of metal, e.g., gold, as the cathode and the opposite surface populated with a pattern of metal pixels which serve as anodes. The anode pixels in turn are comprised of a gold-nickel-gold alloy and formed using photolithography processing, leaving finely defined high resistivity gaps (called inter-pixels) separating one from the other. The substrate wafer is formed, including polishing and etching, to assure its surfaces are prepared for metal deposition. In one embodiment, the metalized substrate has side walls which include an electrically insulating coating, and the formed detector is positioned within an electrically conductive housing which protects the detector from background magnetic fields while being transparent to x-ray and gamma ray radiation. In another embodiment, the side walls include passivation layers for improved product reliability. These formed oxide layers, e.g., of tellurium oxide, may be formed using alkali hypochloride, for example. Passivation materials may also be deposited between the individual pixels, in the inter-pixel regions.

Citation of the above documents is not an admission that any are prior art to the instantly claimed invention nor is this citation an assertion that an exhaustive search has been conducted.

As defined herein, the present invention represents a new and unique method of making a semiconductor radiation detector in which deleterious effects associated with the manufacture of many such detectors are substantially eliminated. This new method is made possible using modified known processing and other techniques associated with semiconductor detector manufacture such that the final costs to the finished products are maintained relatively low. It is believed that such an invention represents a significant advancement in the art.

SUMMARY OF THE INVENTION

It is, therefore, a primary object of this invention to enhance the art of semiconductor radiation detectors.

It is another object of this invention to provide a new and unique design for a detector substrate prior to dicing thereof which in turn will substantially prevent deterioration to the substrate's side walls.

It is still another object of this invention to provide a new and unique method of making a detector which is relatively easy to implement to thereby substantially eliminate excessive added costs to the final product.

According to one embodiment of the invention, there is provided method of making a semiconductor radiation detector which comprises providing a semiconductor substrate having substantially planar upper and lower opposing surfaces having first and second surface areas, respectively, these first and second surface areas being defined by prospective dice lines. The method further comprises forming a first metal layer on the upper surface such that this first metal layer has a surface area less than the first surface area as defined by spaces on the upper surface between this first metal layer and prospective dice lines which define the first surface area, forming a second metal layer on the lower surface and dicing the substrate through the prospective dice lines to produce a semiconductor radiation detector having substantially planar upper and lower opposing surfaces wherein the planar upper surface has a third surface area substantially identical to the surface layer of the first metal layer. The semiconductor radiation detector further includes substantially perpendicular side walls which will not be significantly damaged or contaminated as a result of performing the method taught herein.

According to another embodiment of the invention, there is provided a semiconductor radiation detector comprising a semiconductor substrate having substantially planar upper and lower opposing surfaces having first and second surface areas respectively, these first and second surface areas being defined by prospective dice lines, a first metal layer on the substantially planar upper surface such that this first metal layer will have a surface area less than that of the substantially planar upper surface as defined by spaces on the substantially planar upper surface between the first metal layer and the prospective dice lines which define said first surface area, and a second metal layer on the substantially planar lower opposing surface. The detector in this form is now ready for dicing along the prospective dice lines to thereby determine the final overall outer periphery thereof.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE ILLUSTRATED EMBODIMENTS

For a better understanding of the present invention, together with other and further objects, advantages and capabilities thereof, reference is made to the following disclosure and appended claims in connection with the above-described drawings. It is understood that like numerals will be used to indicate like elements from drawing figure to drawing figure.

As understood from the description herein, the present invention provides a new and unique design and fabrication process to limit the potential adverse effects of post-diced side surfaces on final detector performance. The basic concept involves the recession of at least one electrode metallization layer from the semiconductor dice line to prevent direct physical contact between the dicing blade and metal. Formation of the metal layer(s) may be accomplished by slightly modified conventional means including, e.g., shadow masking (e.g., where sputtering occurs through a metal, e.g., nickel, mask), photolithographic processing, or the desired spaces between metal and eventual dicing blade engagement with the substrate may be formed by metal removal, e.g., using a scribe-dice tool. Dicing may then occur. Significantly, advantageous results have been attained when the method of this invention has been performed on a mass production basis, thereby reducing scrap and final overall manufacturing costs.

Figure 1:
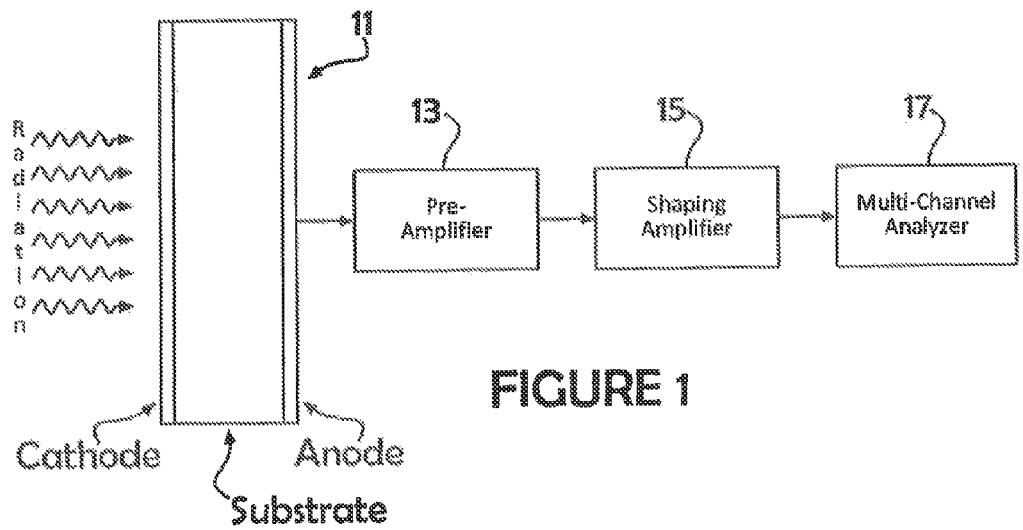
FIG. 1 is a diagram view of one example of a planar semiconductor radiation detector and its associated signal chain.

FIG. 1 is a diagram view of one example of a known planar semiconductor radiation detector 11 and associated signal chain (e.g., for photon counting). Detector 11, as is typical of such planar detectors, has a first planar surface with a metal cathode electrode thereon and an opposing also planar surface having a metal anode electrode (or several such anode electrodes, e.g., pixel electrodes) thereon. The semiconductor substrate itself may be of the aforementioned CdTe or CdZnTe material, or of another acceptable material known in the art, e.g., lead iodide, silicon, gallium arsenide or thallium bromide. As shown, the cathode electrode is normally positioned towards the incoming radiation while the anode electrode is located facing away from this radiation. The cathode and anode metals may be gold, platinum, indium, etc., and are formed on the opposing surfaces often using evaporation, electro-less disposition or sputtering processes. The resulting detector 11 is often electrically coupled to a pre-amplifier 13, which in turn is coupled to a shaping amplifier 15 which is then coupled to a multi-channel analyzer 17 or similar binning or counting logic components. This associated signal chain is not intended to be limiting of such detectors but is provided here for ease of explanation and illustration. Most particularly, this illustration is intended to show the type of detectors (planar with opposing electrode layers) which the method taught herein is meant to improve upon. Further description is not deemed necessary.

Figure 2:
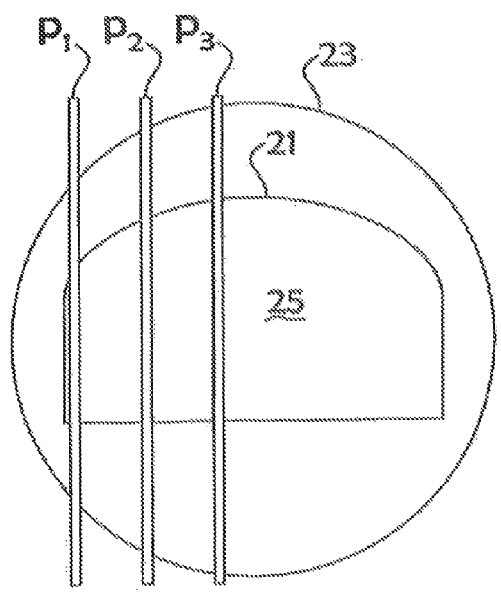
FIG. 2 is a top plan view of a known semiconductor substrate positioned on a supporting wafer and showing three of the proposed paths the dicing blade will pass through the substrate.

The top plan view of FIG. 2 is that of a known semiconductor substrate 21 intended for use as a semiconductor radiation detector, this substrate 21 being positioned on a supporting wafer 23 (e.g., of silicon) and having the upper surface (facing the viewer) fully covered with a metal layer 25 formed in a desired pattern. This pattern, as seen, is not limited to the shape illustrated but may be of several different configurations. Three of the intended vertical paths, P1, P2 and P3, of the dicing blade(s) (not shown in FIG. 2) which will dice substrate 21 are shown, it being understood that more such dicings of substrate 21 are intended. These intended paths may also be referred to as prospective dice lines for the substrate. The much enlarged partial view of FIG. 3 better illustrates substrate 21 with its upper planar surface 27 having the top metal layer 25 thereon. Specifically, the entire area of upper surface 27 is covered with metal such that the resulting surface area of this metal for each individual detector to be formed is identical to the corresponding surface area of each individual substrate on which the metal is formed. In this particular embodiment, layer 25 is of a metal as cited above and is intended to serve as the cathode electrode in the final detector product. In one embodiment, layer 25 is from only about 100 Angstroms to about 100,000 Angstroms, but this of course is not limiting of this invention.

Figure 3:
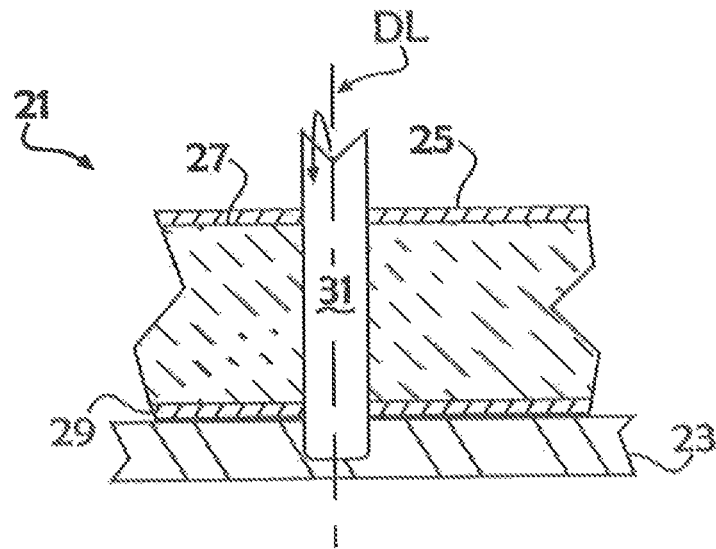
FIG. 3 is a partial side elevational view, on a much enlarged scale over the view of FIG. 2, showing the semiconductor substrate of FIG. 2 positioned on the supporting wafer and being diced by a dicing blade, the substrate shown as having metalized upper and lower planar surfaces wherein the metal extends entirely across the opposed planar surfaces.

In FIG. 3, the substrate body 21 is better seen, this being of one or more of the also aforementioned semiconductor materials. In this particular embodiment, the material is CdZnTe and the body has a thickness within the range of from about 0.1 millimeter to about ten millimeters. Again, these dimensions are not limiting of this invention as the body may be much thicker or even thinner. Substrate 21 is also seen to include bottom metal layer 29 which, like upper layer 25, covers the full bottom surface of the substrate. The substrate with its metal layers is also shown in FIG. 3 as being positioned on the described supporting silicon wafer 23, and in one embodiment the substrate is removably secured to wafer 23 using an appropriate adhesive known in the art for manufacturing purposes. Significantly, FIG. 3 shows one of the dicing blades 31 as it dices through the substrate and both metal layers, and even partially into supporting wafer 23. Blade 31 moves rotationally in a direction toward the viewer in this embodiment as it traverses the paths P1, P2 and P3. In one embodiment, blade 31 may have a width of only about 0.1 millimeter to about one millimeter. Understandably, the dicing operation shown in FIG. 3 results in formation of several individual detector substrates having the desired upper and lower metal surfaces.

Unfortunately, the performance of substrates having fully metalized surfaces as shown above is unacceptable due to contamination and defects formed within the substrate body's side walls following the above dicings. An example of such irregularities, albeit somewhat exaggerated for ease of illustration, is shown in the much enlarged view of FIG. 4. Here, metal from layer 25 is shown intruding within the semiconductor material from the dicing operation, also resulting in damage to the integrity of the material's perpendicular (to the top and bottom planar surfaces) side wall 33. Because the top metal layer fully covers the substrate's top surface, similar damage occurs to the opposite side wall (not shown). As explained below with respect to the diagram of FIG. 9, such smearing and other damage to the side walls adversely affects the desired resistance and other parameters necessary for a successful end product. These problems cannot be satisfactorily addressed by known surface passivation methods, and, in the particular case of extremely thin detectors, may lead to total device failure. Even the addition of a guard electrode to hopefully improve the device performance, in addition to adding to the costs and complexity of the product, is not considered a satisfactory solution to these problems.

Figure 5:
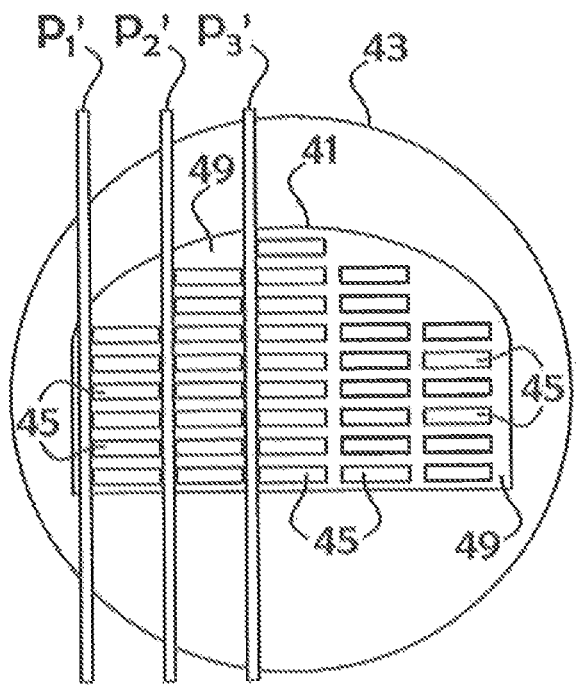
FIG. 5 is a top plan view, on a scale similar to that of FIG. 2, of a semiconductor substrate having a plurality of spaced, metalized upper and lower planar surface portions, according to one embodiment of the invention. This substrate is also positioned on a supporting wafer as is the substrate of FIG. 2, with FIG. 5 also illustrating some of the intended paths the dicing blade or blades will travel in dicing the many metalized portions.
Figure 6:
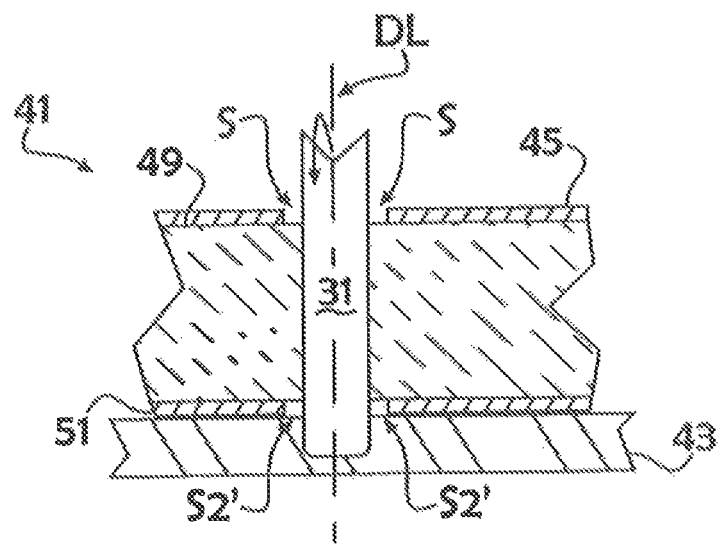
FIG. 6 is a partial side elevational view, on a much enlarged scale over the view of FIG. 5, showing the semiconductor substrate of FIG. 5 positioned on an supporting wafer and being diced by a dicing blade in a similar manner as the FIG. 3 substrate except that in this case, the metalized surface portions of the substrate are recessed from the dice line through which the dicing blade passes.
Figure 7:
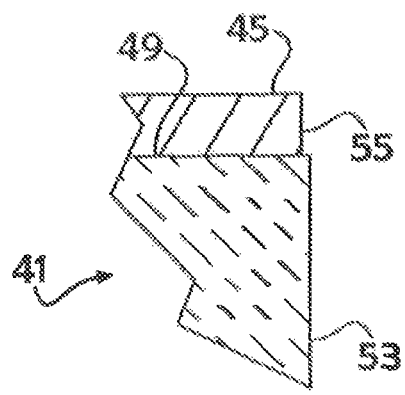
FIG. 7 is a partial side elevational view, in section and on a much enlarged scale over the view of FIG. 6, better illustrating that resulting damage, e.g., metal particle smearing into the semiconductor crystalline material, as occurred during the dicing operation of FIG. 3, is substantially prevented during the dicing of the FIG. 6 substrate.

The new and unique solution offered by the present invention is now defined with respect to FIGS. 5-7. Specifically, in FIG. 5, there is shown a top plan view of a single large semiconductor substrate 41, which is intended to provide several individual detector substrates. Substrate 41 is positioned on a supporting wafer 43 (e.g., of silicon) as was substrate 21. The upper surface (facing the viewer) of substrate 41 is shown to include a desired pattern of several individual metallized portions 45 which are strategically spaced one from another. Understandably, each metalized portion 45 represents the upper metal layer (and preferably the anode electrode) of each final semiconductor detector. As in FIG. 2, three of the intended vertical paths, P1', P2' and P3' of the dicing blade(s) (not shown in FIG. 5) which will dice substrate 41 into the several individual detectors are shown. It is further understood in FIG. 5 that several horizontal dicings (e.g., as many as ten in this particular embodiment) will also be made, thus defining a total of thirty-seven individual detectors. Significantly, each of these metalized portions include the cited spaces there-between to assure that the dicing blades do not physically engage these portions during dicing. This is further explained below.

Deposition of the recessed metal layers for both the upper metal portions (which as stated preferably serve as the anode electrodes) and the lower metal portions (which eventually serve as the cathode electrodes), is preferably accomplished using shadow masking where metal deposition occurs through a metal mask. It is also possible to use photolithographic processing for this deposition, (it is understood that surface preparation (e.g., etching, polishing) and cleaning (e.g., chemically, mechanically) steps may be performed prior to metal deposition, such steps known in the art.) It is further understood that subsequent steps following metal deposition and dicing such as passivation (e.g., chemically, mechanically, thermally) and encapsulation may also be performed as part of making the detector of the present invention. Such additional steps are known in the art and further description is not considered essential. The above deposition results in the defined spaces S and S2 within the upper and lower tile. The invention is not limited to these particular processes as modifications to such processing as well as utilization of other processes are within the knowledge of one skilled in this art.

As an alternative to deposition using shadow masking or photolithographic processing, it is within the scope of this invention to form substantially full metal layers similar to the layers formed and shown in FIG. 3 and then selectively remove portions of the metal using mechanical means such as a scribe tool or the like, to form spaces S and S2.

Most significantly, the individual surface areas of each upper metal portion (for each detector) are smaller than the corresponding upper surface area of the respective semiconductor tile prior to dicing. The difference in comparative surface areas is due to the spaces allocated between the edges of the formed metal portions and the prospective dice lines through which the dicing blade(s) will pass (the actual dice lines being shown in FIGS. 3 and 6 by the reference DL). In the embodiment of the invention shown herein, this is equally true for the bottom metal portions 51 which in turn may be of equal size and possess spaced locations as the top metal counterparts. Therefore, these lower metalized layers will be of substantially similar final surface area as the corresponding lower surface area of the substrate tile, but substantially reduced prior to dicing. This disparity of surface areas will be even further understood with the description of FIGS. 6 and 8 below.

The much enlarged partial view of FIG. 6 better illustrates substrate 41 with its upper planar surface 49 (also seen in FIG. 5) having the top individual metal layer portions 45 thereon. Unlike the known substrate of FIGS. 2 and 3, however, and as explained above, metal layer portions 45 do not fully cover surface 49 but are formed so as to provide a spacing S between the metal periphery and the blade 31 during dicing, as now seen occurring in FIG. 6. This spacing is exaggerated in FIG. 6 for ease of illustration and may actually be much smaller, and substantially invisible when viewed by the human eye, during dicing. Hence, it bears repeating that the final surface areas for the metal portions on the final upper and lower surfaces of each individual detector substrate may maintained substantially similar to the corresponding surface area of the substrate upon which each reside. Alternatively, even wider spaces may have performance advantages independent of processing issues due to electrode geometry and insulating path lengths.

In the embodiment of FIG. 6, substrate 41 may be of CdZnTe with a body (tile) thickness within the range of from about 0.1 millimeter to about ten millimeters, while the upper metal layer portions 45 each have a thickness of from about 100 Angstroms to about 100,000 Angstroms. The portions may be of gold or other metals cited above. The corresponding metal layer portions 51 on the substrate undersurfaces are of similar metal and thickness. In this invention, the formed spaces each have a predetermined width, while of course the dicing blade used to dice through the substrate has its own thickness. With respect to the dimensions and materials cited for the invention, the ratio of each of these predetermined space widths to that of the corresponding blade thickness (width) is within the range of from about 100:1 to about 10:1. This also is not limiting of the invention as other combinations and permutations are possible.

When all dicings have occurred on substrate 41, as explained above, it is thus understood that the respective upper metal layer portions for each individual substrate detector may be maintained substantially equal to the corresponding upper substrate surface area, whereas the upper metal surface areas were initially less prior to dicing (due to spaces provided). In the invention as shown in FIG. 6, this area differential is also the case with the undersurface metal and body areas because of the similar recessing of the corresponding bottom metal layer portions 51, spaced from the dicing blade a distance of S2'.

Figure 4:
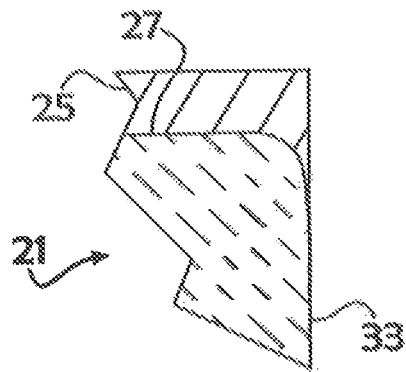
FIG. 4 is a partial side elevational view, in section and on a much enlarged scale over the view of FIG. 3, better illustrating the resulting damage, e.g., metal particle smearing into the semiconductor crystalline material, resulting from the dicing of the FIG. 2 substrate as performed in FIG. 3.

FIG. 7 better illustrates the advantageous results using the teachings of this invention where it can be seen that virtually no metal from the upper metal layer portion 45 has intruded within (been smeared across) the corresponding perpendicular side wall 53 of the now diced substrate body 41. This FIG. 7, like FIG. 4, is of course to be somewhat exaggerated (for ease of explanation) but the desired results are attained nonetheless. Side walls 53 (on this side of the detector as well as on the other vertical side wall, not shown) are substantially void of impurities of metal, including of particle form. Other damage, e.g., chipping, is also substantially prevented. The final result, of course, is not only less scrap during manufacture but also final products of greater quality. While the edge 55 of metal 45 is shown as being aligned with the corresponding edge of side wall 53, it is worth repeating that FIG. 7 is an exaggerated view and such an aligned orientation may not occur, e.g., the metal edge 55 may still be slightly recessed from the vertical side wall 53. Such a final displacement is indeed extremely minimal if at all, such that the upper metal surface area still meets the definition of being substantially similar to that of the corresponding supporting substrate surface. This is also true when the lower metal portions are initially recessed (spaced) from the prospective dice lines.

Figure 8:
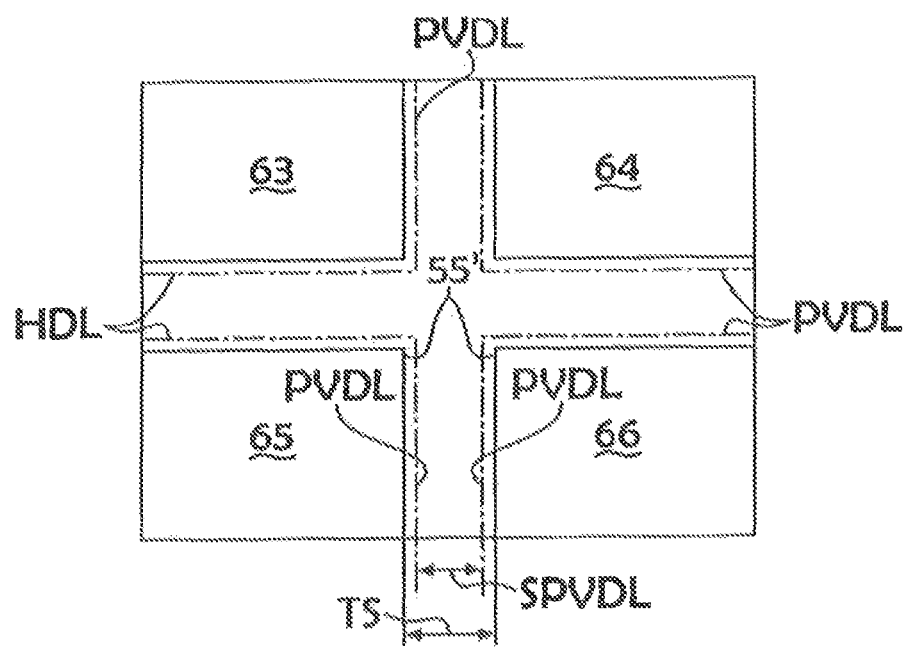
FIG. 8 is another top plan view of a multi-detector substrate according to the teachings herein, illustrating the recessed metalized portions (top surfaces being shown only), the prospective dice lines which serve to define the final outer peripheral walls of each detector, and the relative spaces between adjacent detectors in comparison to the corresponding dice lines.

FIG. 8 is a top plan view of a multi-detector substrate 61 according to the teachings herein, illustrating four recessed metalized portions 63-66 which are intended to comprise the anode electrodes for the resulting detectors. Substrate 61 may be a part of the substrate shown in FIG. 5 with the metalized portions 63-66 being four of those referenced in FIG. 5 by the numerals 45. Both vertical and horizontal prospective dice lines are shown and referenced with PVDL and PHDL designations, respectively. The spacing (SPVDL) between corresponding prospective vertical dice lines is, in one embodiment, from about 0.1 millimeter to about one millimeter, given a substrate and metal layers having dimensions cited above. The corresponding spacing between adjacent recessed metal edges (55') is from about 0.1 millimeter to about three millimeters and is referenced by the designation TS. These dimensions for the upper metal layers may be identical to corresponding dimensions for the bottom (lower) metal layers, and further description is not considered necessary at this point.

Figure 9:
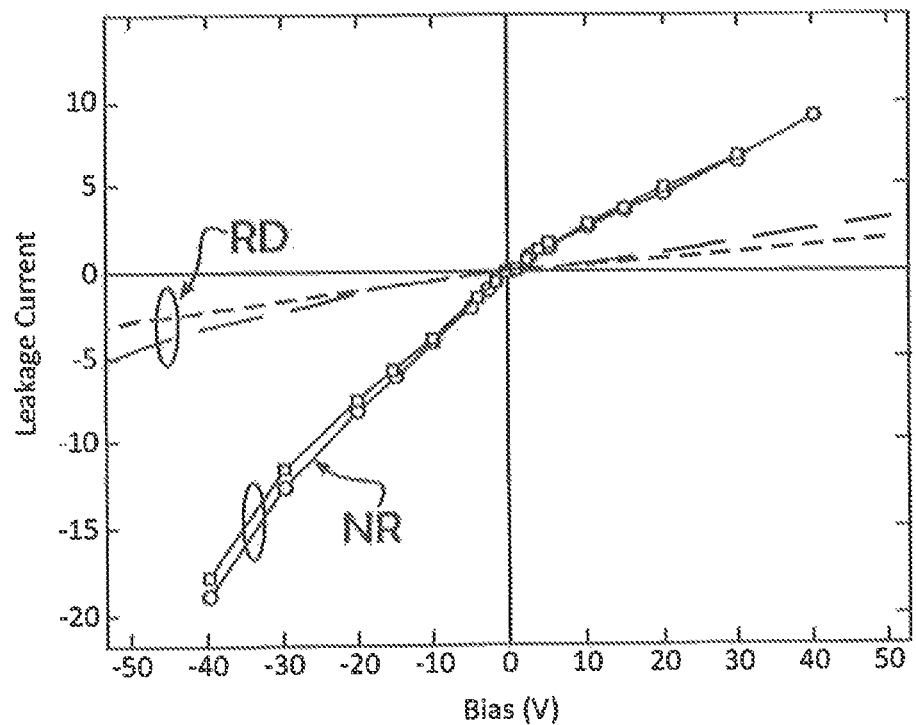
FIG. 9 is a diagram illustrating a comparison of room temperature current-voltage characteristics of two pairs of diced planar detectors, one pair (RD, shown in broken lines having different line spacings) from the method taught herein having only the top layer recessed, in comparison to readings obtained from a diced substrate (NR) having no recessed upper and lower metal layers.

FIG. 9 illustrates a comparison of the room temperature (e.g., 23 degrees Celsius) current-voltage characteristics of two detector groups, each detector having a thickness of 500 microns and diced from the same larger wafer. One group (two detectors) of these, produced using the invention's teachings and having a singular upper layer recessed prior to dicing while in the other group (also two detectors), neither of the two layers was recessed. In this particular embodiment, the top surface electrode areas were about 27 square millimeters (sides of 9 millimeters and 3 millimeters, respectively). This comparison shows that side surface leakage current is significantly larger for the detectors diced without metal layer recessing. That is, the readings (RD) for the invention's detectors are significantly better than those (NR) of the detectors wherein the metal layering extended entirely over the top metal surface and was thus directly contacted by the rotational dicing blade(s). As described above, this represents an important enhancement for products manufactured using the teachings herein.

Figure 10:
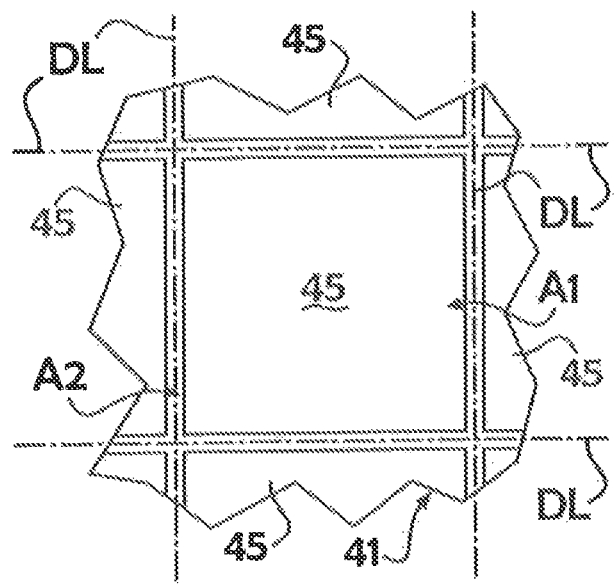
FIG. 10 is a top plan view better illustrating the initial metal surface area for the upper cathode electrode of a detector in comparison to the substrate's total area under this metal as defined by prospective dice lines DL along which the dicing blade passes. Adjacent metal surface areas of adjacent substrates are also shown to even further illustrate this initial metal surface area relationship to that of the substrate's outer periphery.

The plan view in FIG. 10 clearly shows the entire upper surface area of one of the upper electrode metal layers 45 which is formed atop the respective substrate tile. For ease of illustration, the tile and adjacent metal layers are only partially shown. As seen, the area A1 of the metal electrode as first formed is less than the corresponding area A2 of the supporting substrate tile which in turn is defined by the prospective dice lines DL (four in total for this rectangular member). Similar area relationships may exist for the bottom metal layer used for the lower electrode, provided recessing of this lower metal layer is also desired. In one embodiment of this invention, the ratio of the initial metal surface area A1 to that (A2) of the corresponding upper surface area of the supporting substrate is from about 1:10 to about 1:1.002. A similar ratio range may exist for the lower metal and lower surface areas, assuming lower metal recessing is performed. By way of example, in one embodiment, the original upper surface area of metal layer 45 was 2.25 square millimeters while the supporting substrate's surface area was 2.43 square millimeters. These ratios and areas are not limiting of this invention because others are acceptable. Once dicing has occurred along the dicing lines DL, it is now better understood why the corresponding initial surface area A1 becomes substantially similar to that of the upper surface of the substrate tile. Similarly, the under surface area of the bottom metal layer will be of similar area as that of the tile's lower surface area.

Thus there has been shown and defined a new method of making a semiconductor radiation detector and a new design thereof which extends the useful application range of such high-resistivity products to those of miniature design, e.g., those used for low energy radiation detection, dosimetric readings, nuclear imaging and other applications, including those where high efficiency is not a major concern. The invention is also extendable to stacked detector designs, including those of side-radiated configuration. Even further, the invention as defined herein serves to simplify the detector fabrication process, provide high manufacturing yields, and still assure that highly reliable products are the result.

Since other combinations, modifications and changes varied to it particular environments will be apparent to those skilled in the art, the invention is not considered limited to the chosen preferred embodiments for purposes of this disclosure, but covers all changes and modifications which do not constitute departures from the true spirit and scope of this invention.

Having thus described the invention, what is desired to be protected by Letters Patent is presented in the subsequently appended claims.

The invention is claimed as follows:

1. A semiconductor radiation detector comprising:
a semiconductor substrate having substantially planar upper and lower opposing surfaces having first and second surface areas respectively, the first and second surface areas being defined by prospective dice lines;
a first metal layer on the substantially planar upper surface such that the first metal layer will have a surface area less than the first surface area of the substantially planar upper surface as defined by spaces on the substantially planar upper surface between the first metal layer and the prospective dice lines which define the first surface area; and
a second metal layer on the substantially planar lower opposing surface.

2. The semiconductor radiation detector as defined in claim 1, wherein the semiconductor substrate is comprised of at least one of cadmium telluride, cadmium zinc telluride, lead iodide, silicon, gallium arsenide, and thallium bromide.

3. The semiconductor radiation detector as defined in claim 1, wherein the first metal layer is comprised of a metal selected from the group consisting of gold, platinum, indium and alloys thereof.

4. The semiconductor radiation detector as defined in claim 1, wherein the second metal layer is comprised of a metal selected from the group consisting of gold, platinum, indium and alloys thereof.

5. The semiconductor radiation detector as defined in claim 1, wherein the second metal layer will have a surface area less than the second surface area of the substantially planar lower surface as defined by spaces on the substantially planar lower surface between the second metal layer and the prospective dice lines prior to the dicing.

6. The semiconductor radiation detector of claim 1, wherein
the semiconductor substrate has at least one side wall which is generally perpendicular to the substantially planar upper and lower opposing surfaces; and
the first metal layer has an outer edge which is generally in alignment with, or recessed from, the at least one side wall of the semiconductor substrate.

7. The semiconductor radiation detector as defined in claim 6, wherein the at least one side wall is substantially void of impurities of metal.

8. The semiconductor radiation detector as defined in claim 6, wherein the semiconductor substrate is comprised of a material selected from the group consisting of cadmium telluride, cadmium zinc telluride, lead iodide, silicon, gallium arsenide, and thallium bromide.

9. The semiconductor radiation detector as defined in claim 6, wherein the first metal layer is comprised of a metal selected from the group consisting of gold, platinum, indium and alloys thereof.

10. The semiconductor radiation detector as defined in claim 6, wherein the second metal layer is comprised of a metal selected from the group consisting of gold, platinum, indium and alloys thereof.

11. The semiconductor radiation detector as defined in claim 6, wherein the second metal layer has an outer edge which is generally in alignment with, or recessed from, the at least one side wall of the semiconductor substrate.

12. The semiconductor radiation detector as defined in claim 6, wherein the semiconductor substrate has four side walls.

13. The semiconductor radiation detector as defined in claim 6, wherein the first metal layer is an anode electrode, and wherein the second metal layer is a cathode electrode.

14. The semiconductor radiation detector as defined in claim 6, wherein the semiconductor substrate has a thickness within a range of from about 0.1 millimeter to about ten millimeters.

15. The semiconductor radiation detector as defined in claim 6, wherein the first metal layer has a thickness within a range of from about 100 Angstroms to about 100,000 Angstroms.

16. The semiconductor radiation detector as defined in claim 6, wherein the second metal layer has a thickness within a range of from about 100 Angstroms to about 100,000 Angstroms.

17. An assembly comprising:
- a semiconductor substrate having substantially planar upper and lower opposing surfaces;
- a plurality of first metal layers on the substantially planar upper surface, each first metal layer having edges which are spaced apart from edges of adjacent first metal layers;
- prospective dice lines provided on the semiconductor substrate between the edges of adjacent first metal layers, wherein the prospective dice lines have widths which are less than a distance between the edges of adjacent first metal layers; and
- at least one second metal layer on the substantially planar lower surface.

18. The assembly as defined in claim 17, wherein each of the first metal layers has a generally rectangular configuration.

19. The assembly as defined in claim 17, wherein the semiconductor substrate is comprised of a material selected from the group consisting of cadmium telluride, cadmium zinc telluride, lead iodide, silicon, gallium arsenide, and thallium bromide.

20. The assembly as defined in claim 17, wherein each of the first metal layers are comprised of a metal selected from the group consisting of gold, platinum, indium and alloys thereof.

21. The assembly as defined in claim 17, wherein the second metal layer is comprised of a metal selected from the group consisting of gold, platinum, indium and alloys thereof.

22. An assembly comprising:
- a semiconductor substrate having substantially planar upper and lower opposing surfaces;
- a plurality of first metal layers on the substantially planar upper surface, each first metal layer having edges which are spaced apart from edges of adjacent first metal layers; and
- at least one second metal layer on the substantially planar lower surface, wherein the at least one second metal layer comprises a plurality of second metal layers on the substantially planar upper surface, each second metal layer having edges which are spaced apart from edges of adjacent second metal layers.

23. The assembly as defined in claim 17, wherein the semiconductor substrate has a thickness within a range of from about 0.1 millimeter to about ten millimeters.

24. The assembly as defined in claim 17, wherein each of the first metal layers have a thickness within a range of from about 100 Angstroms to about 100,000 Angstroms.

25. The assembly as defined in claim 17, wherein the at least one second metal layer has a thickness within a range of from about 100 Angstroms to about 100,000 Angstroms.

26. The assembly as defined in claim 22, wherein each of the first metal layers has a generally rectangular configuration.

27. The assembly as defined in claim 22, wherein the semiconductor substrate is comprised of a material selected from the group consisting of cadmium telluride, cadmium zinc telluride, lead iodide, silicon, gallium arsenide, and thallium bromide.

28. The assembly as defined in claim 22, wherein each of the first metal layers are comprised of a metal selected from the group consisting of gold, platinum, indium and alloys thereof.

29. The assembly as defined in claim 22, wherein the second metal layer is comprised of a metal selected from the group consisting of gold, platinum, indium and alloys thereof.

30. The assembly as defined in claim 22, wherein the semiconductor substrate has a thickness within a range of from about 0.1 millimeter to about ten millimeters.

31. The assembly as defined in claim 22, wherein each of the first metal layers have a thickness within a range of from about 100 Angstroms to about 100,000 Angstroms.

32. The assembly as defined in claim 22, wherein the at least one second metal layer has a thickness within a range of from about 100 Angstroms to about 100,000 Angstroms.

* * * * *